(12) United States Patent
Liao et al.

(10) Patent No.: US 7,141,868 B2
(45) Date of Patent: Nov. 28, 2006

(54) FLASH PREVENTING SUBSTRATE AND METHOD FOR FABRICATING THE SAME

(75) Inventors: Yu-Lin Liao, Taichung (TW); Chien-Te Chen, Taichung (TW)

(73) Assignee: Siliconware Precision Industries Co., Ltd, Taichung (TW)

( * ) Notice: Subject to any disclaimer, the term of this patent is extended or adjusted under 35 U.S.C. 154(b) by 6 days.

(21) Appl. No.: 11/059,143

(22) Filed: Feb. 15, 2005

(65) Prior Publication Data

US 2006/0125075 A1    Jun. 15, 2006

(30) Foreign Application Priority Data

Dec. 9, 2004    (TW) ............................... 93138069 A

(51) Int. Cl.
*H01L 23/495*    (2006.01)
(52) U.S. Cl. ...................... 257/667; 257/690; 257/762; 438/617
(58) Field of Classification Search ................ 257/667, 257/762, 690; 438/617
See application file for complete search history.

(56) References Cited

U.S. PATENT DOCUMENTS

| | | | |
|---|---|---|---|
| 5,744,084 A | 4/1998 | Chia et al. | |
| 6,281,047 B1 | 8/2001 | Wu et al. | |
| 6,319,750 B1 | 11/2001 | Huang et al. | |
| 6,410,981 B1 * | 6/2002 | Tao | ............................ 257/704 |
| 6,479,894 B1 | 11/2002 | Huang et al. | |
| 6,692,988 B1 | 2/2004 | Fang et al. | |

\* cited by examiner

*Primary Examiner*—Nathan J. Flynn

(57) ABSTRACT

A flash preventing substrate and a method for fabricating the same are proposed. A core defined with a plurality of substrate units is prepared. A circuit patterning process is performed to form circuit structures on the core corresponding to the substrate units, plating buses between the adjacent substrate units and electrically connected to the circuit structures, and a molding ring surrounding all the substrate units. The molding ring is located at a position predetermined for contacting the substrate with a mold. A solder mask layer covers the circuit structures, the plating buses and the molding ring, and is formed with a plurality of openings therein, such that predetermined portions of the circuit structures are exposed via the openings and serve as electrical input/output connections. During a molding process, the mold can tightly abut against the solder mask layer covering the molding ring to prevent outward flashes of an encapsulating material.

15 Claims, 8 Drawing Sheets

FLASH PREVENTING SUBSTRATE AND METHOD FOR FABRICATING THE SAME

FIELD OF THE INVENTION

The present invention relates to flash preventing substrates and fabrication methods thereof, and more particularly, to a substrate capable of preventing flashes during a molding process for a semiconductor package, and a method for fabricating the substrate.

BACKGROUND OF THE INVENTION

In light of significant development of various portable products in communication, network and computer fields, ball grid array (BGA) packages with high densities and multiple contacts have become mainstream products in the semiconductor packaging field. The BGA package usually cooperates with a highly effective chip such as a microprocessor, chip set and graphic chip to achieve high speed operations. An advanced semiconductor packaging technology is employed to fabricate the BGA package, which is characterized by mounting a semiconductor chip on a front side of a substrate and implanting a grid array of solder balls on a back side of the substrate. This allows more input/output (I/O) connections to be accommodated on the same unit area of a chip carrier (e.g. the substrate) to satisfy the requirement for a highly integrated semiconductor chip, such that the entire package unit can be bonded and electrically connected to an external device by the solder balls.

In order to improve the production yield and reduce the fabrication cost for a semiconductor device, current micro semiconductor packages are mostly fabricated by a batch method as disclosed in U.S. Pat. Nos. 6,281,047, 6,319,750 and 6,479,894, etc. The batch fabrication method is implemented by firstly defining a plurality of array-arranged package units on a surface of a chip carrier via a plurality of grid-shaped boundary lines formed on the chip carrier. Then, die-bonding, wire-bonding and encapsulation processes are performed. Subsequently, a singulation process is carried out to remove a connected portion between any two adjacent package units, such that a plurality of independent semiconductor packages are fabricated. For example, a thin and fine pitch ball grid array (TFBGA) package has been proposed and is sized even smaller to satisfy the light-weight and low-profile requirements of electronic products. The TFBGA packages are fabricated on the same substrate in a batch manner. The substrate is in advance defined with a plurality of package sites thereon where a plurality of TFBGA package units are to be formed. Then, the die-bonding, wire-bonding and encapsulation processes are performed. Finally, the singulation process is carried out to separate the package sites and semiconductor chips mounted thereon from each other to form individual TFBGA package units.

Generally, for establishing electrical connection between a semiconductor package unit and an external electronic device via solder balls, or for effectively electrically connecting a semiconductor chip to a substrate in the package unit, a plurality of conductive circuits made of e.g. a copper material are formed on a surface of the substrate. A metallic layer such as a nickel/gold (Ni/Au) layer can be disposed on an exposed surface of a conductive pad extended from each of the conductive circuits. This allows other conductive elements such as gold wires, bumps or solder balls to be effectively electrically connected to the chip or substrate, and also prevents oxidation of the conductive pads due to an external environmental effect. In particular, for fabricating the highly conductive Ni/Au metallic layer, all circuit elements (e.g. the conductive pads) to be subsequently formed with the Ni/Au metallic layer thereon are connected to a plating bus during a circuit fabrication process of the substrate, such that an electroplating current can reach all the circuit elements via the plating bus to deposit the Ni/Au metallic layer on each of the circuit elements. When the packaging processes are complete, the plating bus becomes useless and should be removed.

FIG. 1 shows a semiconductor package substrate for use in batch fabrication of package units. The substrate 100 comprises a plurality of substrate units 10 that are defined and bordered by a plurality of transverse cutting lines SLx and a plurality of longitudinal cutting lines SLy formed on the substrate 100, wherein the substrate units 10 represent package sites to be subjected to subsequent packaging processes. During a final singulation process, the package sites can be separated by cutting along the cutting lines SLx and Sly to form individual package units. Each of the substrate units 10 comprises a plurality of bond pads 11, a plurality of conductive vias 12, and a plurality of conductive circuits 13 for electrically connecting the bond pads 11 to the conductive vias 12, wherein the conductive vias 12 are used to electrically connect the conductive circuits 13 on a front side of the substrate unit 10 to ball pads (not shown) on a back side of the substrate unit 10. In order to deposit a Ni/Au metallic layer on each of the bond pads 11 and ball pads on the front and back sides of the substrate unit 10 respectively by an electroplating process, the bond pads 11 and the ball pads are connected to a plating bus 14 formed around each of the package sites, such that an electroplating current can reach all the bond pads 11 and ball pads on the front and back sides of the substrate unit 10 respectively via the plating bus 14 so as to form the electroplated Ni/Au metallic layer on each of the bond pads 11 and ball pads. The plating buses 14 on the substrate 100 are grid-shaped and directly superimposed on the transverse and longitudinal cutting lines SLx and SLy, such that the plating buses 14 can be simultaneously removed by the final singulation process.

However, the above arrangement of the substrate is inherent with significant drawbacks. FIGS. 2A and 2B are cross-sectional views showing the substrate in FIG. 1 during a molding process respectively taken along lines 2A—2A and 2B—2B. After a chip 210 is mounted on and electrically connected to each of the substrate units 10, the molding process is performed using a mold 250 having an upper mold cavity 251, wherein a clamping area 252 of the mold 250 is positioned in correspondence with a predetermined mold clamp line (MCL) on the substrate 100, such that an encapsulating material 253 can be injected into the upper mold cavity 251 from a gate (not shown) so as to completely fill the upper mold cavity 251 with the encapsulating material 253. As a result, an encapsulant for encapsulating the chips 210 is formed on the substrate 100.

Generally, a solder mask layer 101 is applied on a surface of the substrate 100 and becomes contracted after being heated and cured, wherein more contraction of the solder mask layer 101 occurs at an area with no circuit being provided thereunder. Thereby, at an interface between the substrate 100 and the mold 250, a portion of the solder mask layer 101 covering circuits (i.e. the plating buses 14) becomes higher than another portion of the solder mask layer 101 not covering circuits. This results in collapse or sinking of the solder mask layer 101 between the adjacent plating buses 14. As a result, during the molding process, a gap 220 is formed between the mold 250 and the solder mask layer 101 at a position where the solder mask layer 101 collapses, and the encapsulating material 253 injected into the upper mold cavity 251 would leak through the gap 220 and cause flashes 230 (as shown in FIG. 2C). The flashes 230 not only impair the package appearance, but may further flow to another surface of the substrate 100 along positioning holes, slots or edges of the substrate 100, thereby contaminating the ball pads to be mounted with solder balls on the substrate 100 and adversely affecting the reliability of subsequent fabrication processes.

Referring to FIG. 3, in light of the above drawbacks, U.S. Pat. No. 6,692,988 has disclosed a method of forming at least one dummy trace 313 between two adjacent circuits 310 to avoid an oversized pitch between the adjacent circuits 310. For example, there are two dummy traces 313 formed within a pitch D1 between two adjacent circuits 310, such that the circuits 310 and the dummy traces 313 are evenly distributed, making a solder mask layer applied thereon substantially flat and have an equal height. Therefore, the effect of preventing flashes can be achieved.

However, the above arrangement when being applied to e.g. a TFBGA structure is not effective to completely solve the problem of flashes. This is because no matter where the dummy trace is located, a certain pitch always exists between adjacent circuits (the dummy trace and a plating bus). When the solder mask layer is applied on the plating bus and the dummy trace, there are still a plurality of collapsed portions formed therebetween, which accordingly cause a plurality of smaller gaps between the mold and the solder mask layer during the molding process. Thus, the encapsulating material having good fluidity would leak through the gaps and result in flashes. Moreover, the provision of dummy traces also leads to other drawbacks due to too many dummy traces being in advance formed on a peripheral area of the substrate for the purpose of preventing flashes. In such case, during a singulation process to simultaneously cut the dummy traces and the plating buses, excess burrs are produced and easily cause short-circuiting between adjacent circuits, thereby seriously affecting the electrical quality of a fabricated product.

Referring to FIG. 4, U.S. Pat. No. 5,744,084 has disclosed a method of forming a dam structure 420 on a surface of a substrate 408, wherein the dam structure 420 is used to accommodate a clamping area of an upper mold 402, so as to prevent the foregoing flashes. However, the dam structure 420 must be additionally fabricated after completing the circuitry of the substrate 408, and the fabrication processes of the dam structure 420 are complicated. It is therefore not cost-effective to fabricate the dam structure 420 in practice. Moreover, as various marks may usually be printed on a peripheral area of the substrate by e.g. a substrate manufacturer, the dam structure 420 that is also located on the peripheral area of the substrate would influence the performance of the mark-printing process on the substrate.

Therefore, the problem to be solved here is to provide a flash preventing substrate and a method for fabricating the same, which can eliminate short-circuiting that is possibly induced by a singulation process for a packaged structure, so as to achieve better cost effectiveness.

SUMMARY OF THE INVENTION

In light of the above drawbacks in the prior art, a primary objective of the present invention is to provide a flash preventing substrate and a method for fabricating the same, so as to prevent an encapsulating material from flashing outwardly through an interface between a surface of the substrate and a mold during a molding process.

Another objective of the present invention is to provide a flash preventing substrate and a method for fabricating the same, which can eliminate short-circuiting between adjacent circuits caused by burrs possibly produced in a singulation process for a packaged structure using the prior-art dummy trace technology.

Still another objective of the present invention is to provide a flash preventing substrate and a method for fabricating the same, which can avoid drawbacks such as complicated fabrication processes and inconvenience in mark printing due to provision of a dam structure on a surface of a substrate in the prior art.

A further objective of the present invention is to provide a flash preventing substrate and a method for fabricating the same, by which the fabrication processes are simplified and cost-effective to implement.

In accordance with the above and other objectives, the present invention proposes a flash preventing substrate, comprising: a plurality of substrate units formed with circuit structures; plating buses provided between the adjacent substrate units, wherein the plating buses are extended and electrically connected to the circuit structures of the substrate units; a molding ring surrounding all the substrate units and located at a position predetermined for contacting the substrate with a mold; and a solder mask layer for covering the circuit structures, the plating buses and the molding ring, wherein the solder mask layer is formed with a plurality of openings therein for exposing predetermined portions of the circuit structures, and the exposed portions of the circuit structures serve as electrical input/output (I/O) connections.

The present invention also proposes a method for fabricating the foregoing flash preventing substrate, comprising the steps of: preparing a core defined with a plurality of substrate units; performing a circuit patterning process to form circuit structures on a surface of the core corresponding to the substrate units, plating buses between the adjacent substrate units, and a molding ring surrounding all the substrate units, wherein the plating buses are extended and electrically connected to the circuit structures of the substrate units, and the molding ring is located at a position predetermined for contacting the substrate with a mold; and forming a solder mask layer for covering the circuit structures, the plating buses and the molding ring, wherein the solder mask layer is formed with a plurality of openings therein for exposing predetermined portions of the circuit structures, and the exposed portions of the circuit structures serve as electrical I/O connections.

Therefore, by the flash preventing substrate and the method for fabricating the same proposed in the present invention, a molding ring is formed at a peripheral position of the substrate surrounding all the substrate units simultaneously in a process of fabricating circuits for the substrate, and then a solder mask layer is applied on a surface of the substrate. This allows a mold used in a subsequent molding process to tightly abut against the solder mask layer covering the molding ring, so as to prevent outward flashes of an encapsulating material. Unlike the substrate in the prior art, the present invention can eliminate short-circuiting caused by burrs produced in a singulation process due to provision of dummy traces. Moreover, the present invention does not need to additionally fabricate a dam structure on the substrate after completing the circuitry of the substrate, such that the fabrication time and cost can both be reduced, and a mark-printing process to be performed on the substrate would not be affected.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
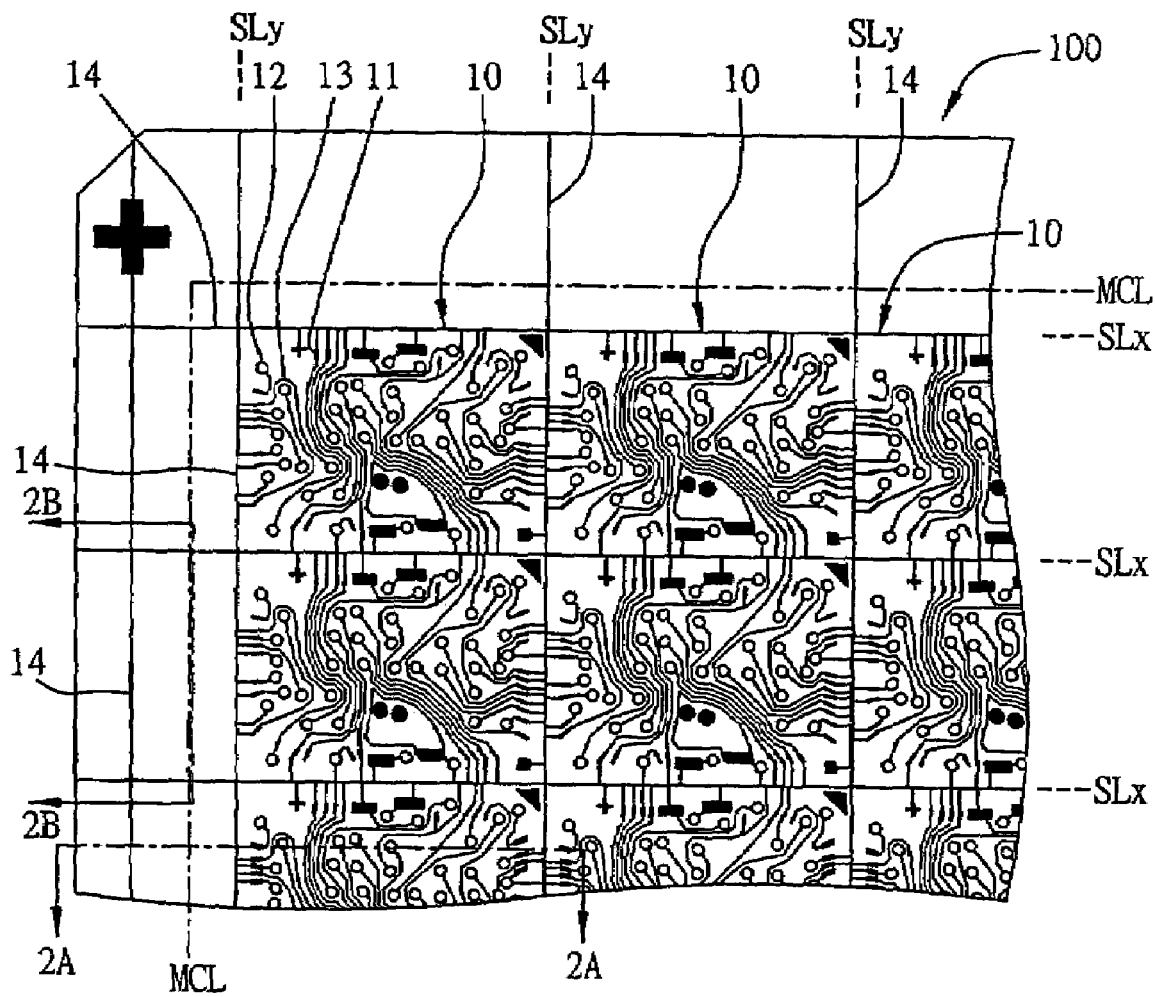
FIG. 1 (PRIOR ART) is a schematic diagram of a conventional substrate.
Figure 2A:
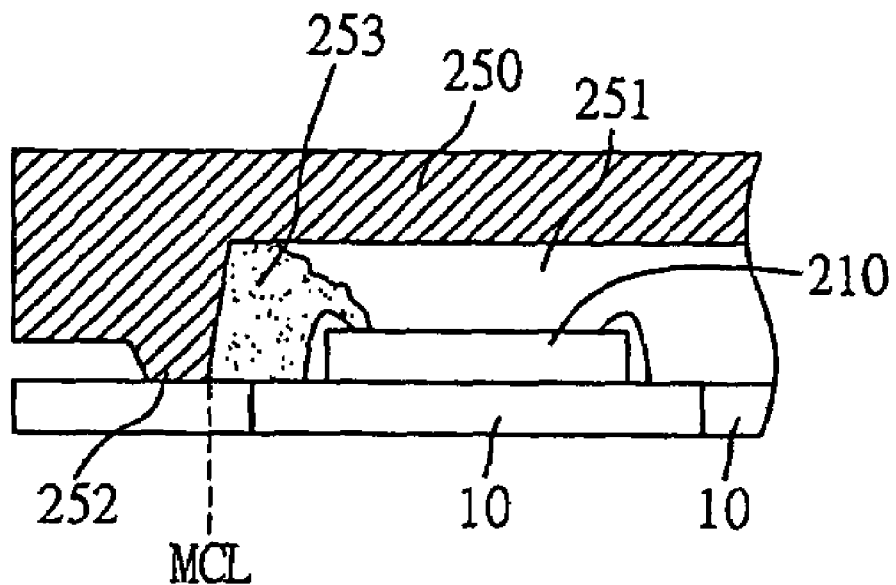
FIGS. 2A and 2B (PRIOR ART) are cross-sectional views showing the substrate in FIG. 1 during a molding process respectively taken along lines 2A—2A and 2B—2B.
Figure 2B:
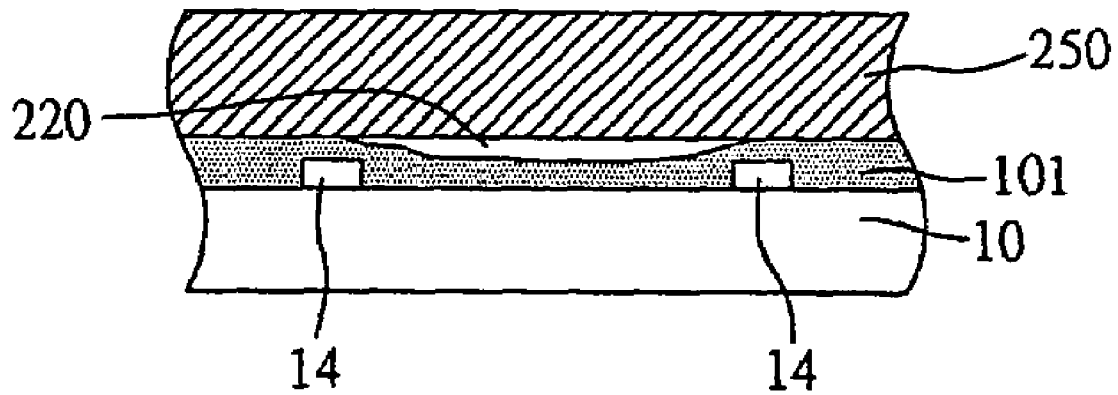
Figure 2C:
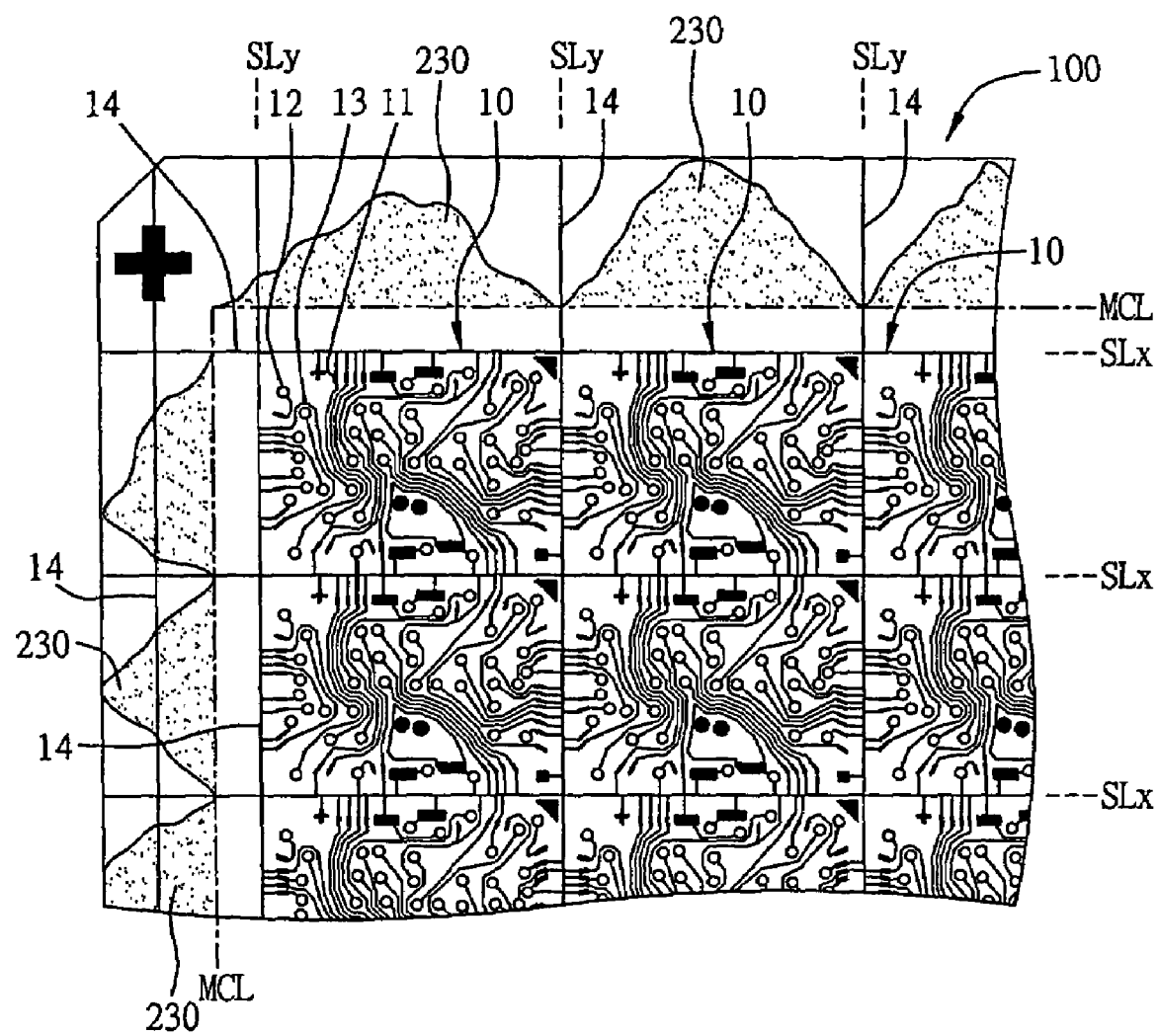
FIG. 2C (PRIOR ART) is a schematic diagram showing flashes being produced in the molding process.
Figure 3:
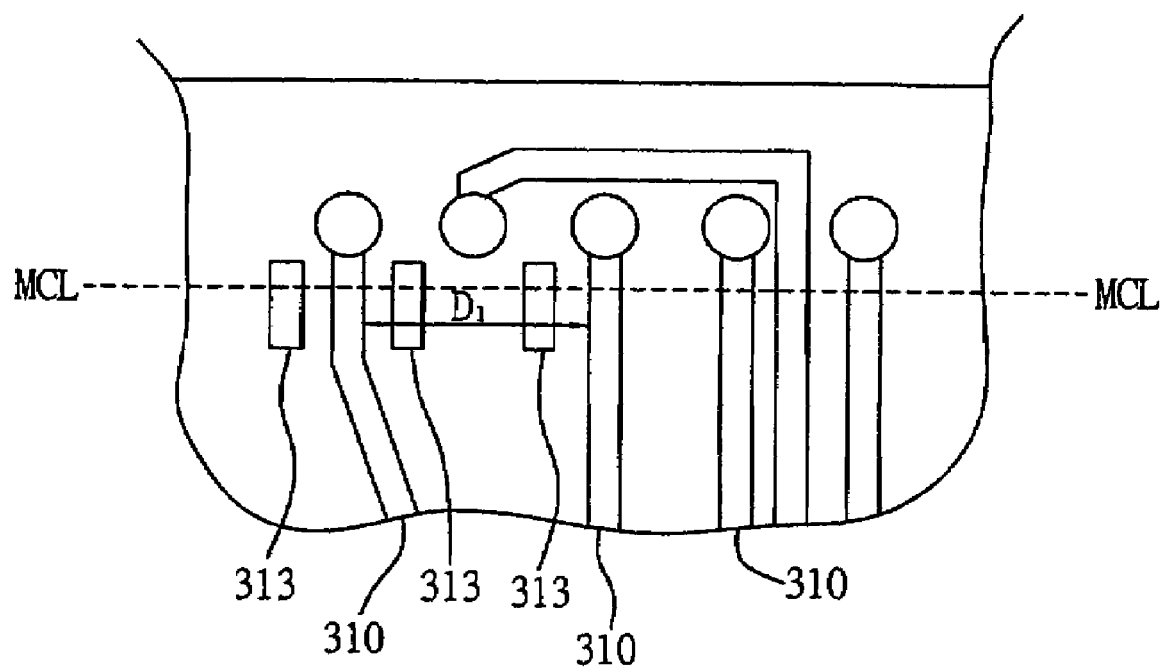
FIG. 3 (PRIOR ART) is a top view showing dummy traces being provided between adjacent circuits according to U.S. Pat. No. 6,692,988.
Figure 4:
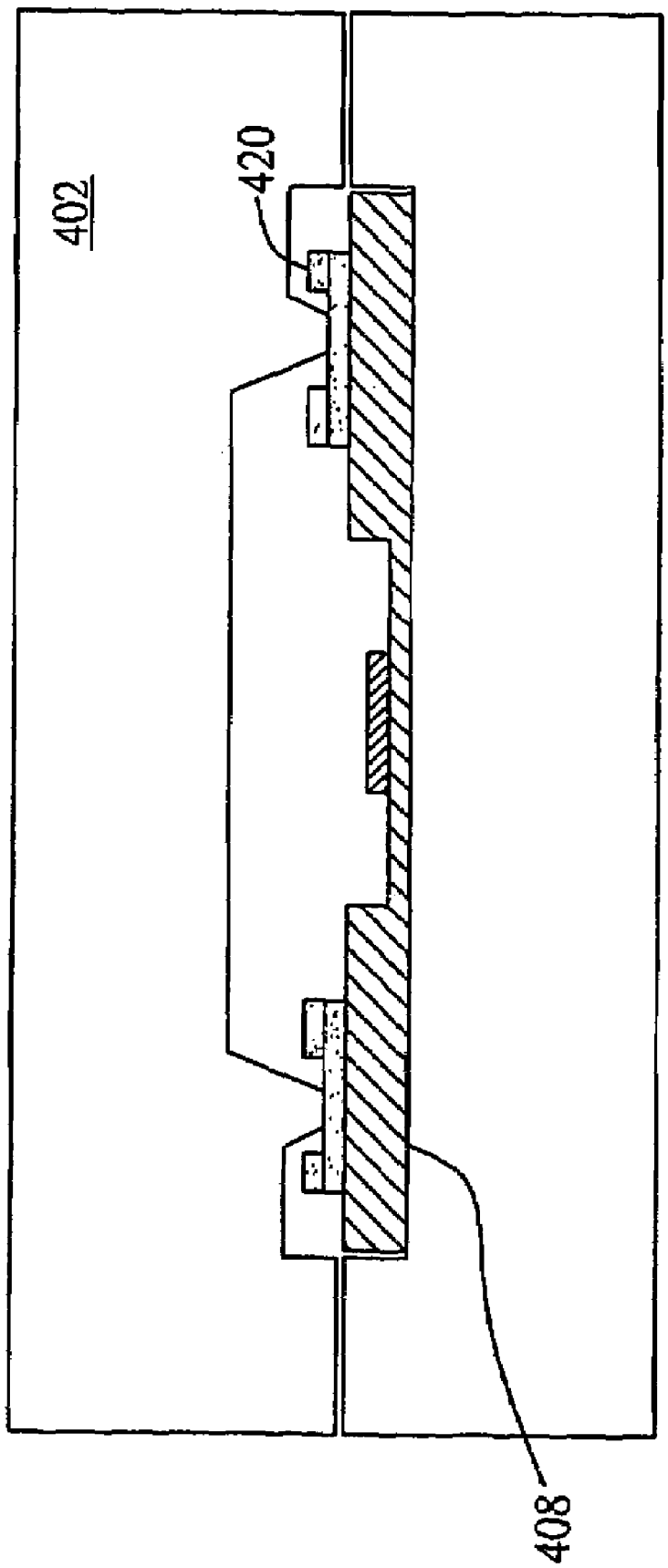
FIG. 4 (PRIOR ART) is cross-sectional view showing a dam structure being formed on a surface of a substrate according to U.S. Pat. No. 5,744,084.
Figure 5A:
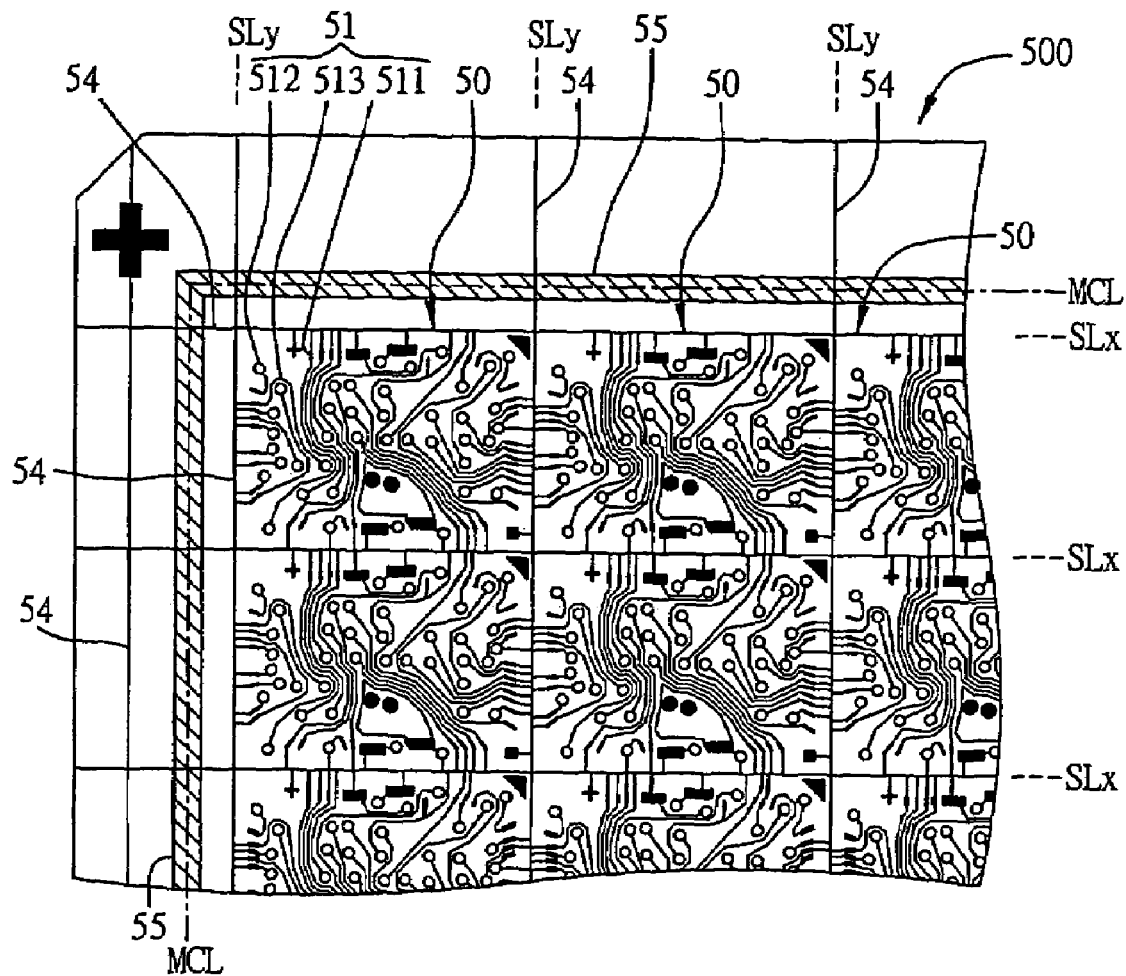
FIG. 5A is a top view of a flash preventing substrate according to the present invention.
Figure 5B:
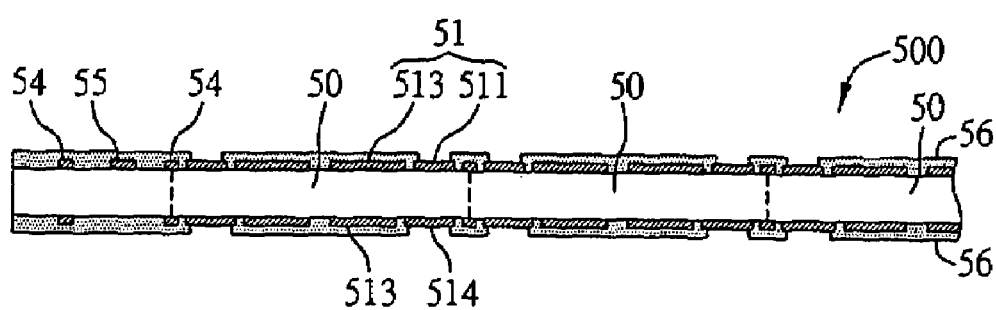
FIG. 5B is a cross-sectional view of the flash preventing substrate according to the present invention.

FIGS. 5A and 5B are respectively a top view and a cross-sectional view of a flash preventing substrate according to the present invention, and are used to describe a preferred embodiment of the substrate in detail below. It should be noted that the drawings are simplified schematic diagrams for illustrating the basic structure of the substrate in the present invention. Thus, the drawings only show relevant elements to the present invention, and the elements are not drawn in real number, shape and size. In practice, the number, shape and size of the elements can be adjusted as an optional design, and the arrangement of elements may be more complicated.

As shown in FIGS. 5A and 5B, the substrate 500 proposed in the present invention comprises a plurality of substrate units 50; plating buses 54 provided between the adjacent substrate units 50, the plating buses 54 being extended and electrically connected to circuit structures 51 of the substrate units 50, wherein the circuit structures 51 comprise bond pads 511, conductive vias 512, conductive circuits 513 and ball pads 514; a molding ring 55 surrounding all the substrate units 50 and located at a position predetermined for contacting the substrate 500 with a mold; and a solder mask layer 56 formed on the substrate units 50 to cover the circuit structures 51 of the substrate units 50, the plating buses 54 and the molding ring 55, wherein the solder mask layer 56 is formed with a plurality of openings 560 therein for exposing predetermined portions of the circuit structures 51 (i.e. the portions such as the bond pads 511 or the ball pads 514, etc.), and the exposed portions of the circuit structures 51 serve as electrical input/output (I/O) connections for the substrate 500.

The substrate unit 50 can be a ball grid array (BGA) substrate unit or a thin and fine pitch ball grid array (TFBGA) substrate unit, wherein the substrate unit 50 shown in the drawings here is a TFBGA substrate unit. The substrate units 50 of the substrate 500 are defined and bordered by a plurality of transverse cutting lines SLx and longitudinal cutting lines SLy formed on the substrate 500, that is, the substrate units 50 represent package sites to be subjected to subsequent packaging processes. In a final singulation process, the package sites can be separated by cutting along the cutting lines SLx and SLy to form a plurality of individual package units.

The plating buses 54 are electrically connected to the circuit structures 51 of the substrate units 50, so as to allow an electroplating current to reach all the circuit structures 51 of the substrate units 50 via the plating buses 54 and form a metallic protection layer (not shown) such as a nickel/gold layer respectively on the portions of the circuit structures 51 exposed from the solder mask layer 56, i.e. on the bond pads 511 and ball pads 514 that serve as the electrical I/O connections for the substrate units 50. The plating buses 54 are directly superimposed on the transverse and longitudinal cutting lines SLx and SLy, and thus can be simultaneously removed by the final singulation process.

Figure 6:
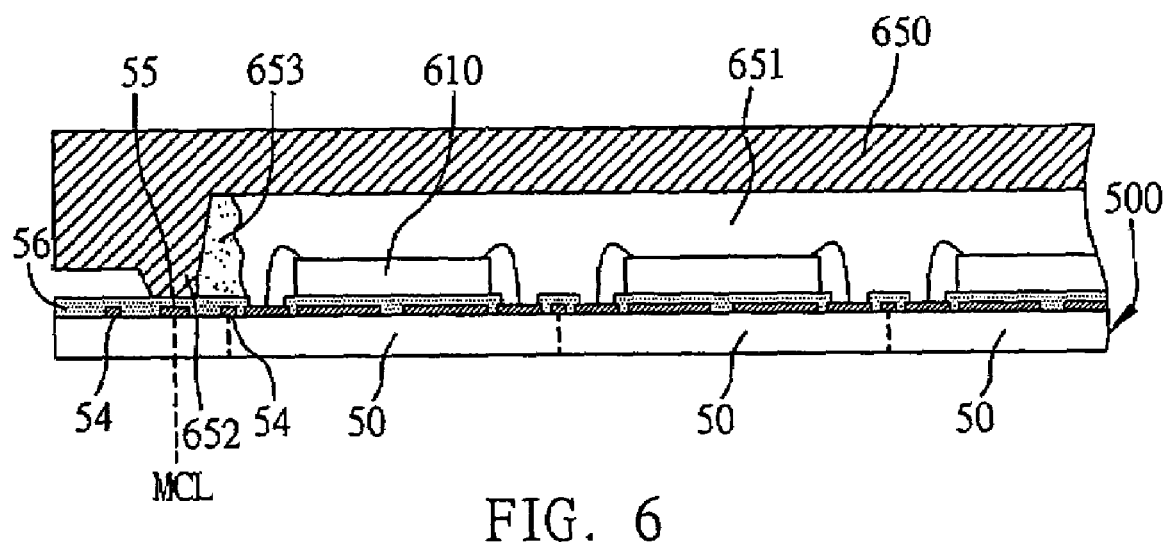
FIG. 6 is a cross-sectional view showing the flash preventing substrate being subjected to a molding process according to the present invention.

The molding ring 55 is primarily made of a metallic copper material, and is formed on the substrate 500 simultaneously in a circuit patterning process for fabricating the circuit structures 51 of the substrate units 50 and the plating buses 54. The molding ring 55 is located at a position predetermined for contacting the substrate 500 with the mold used in a subsequent molding process (i.e. the position of a mold clamp line MCL on the substrate 500, as shown in FIG. 6). After the circuit patterning process for the substrate 500 is complete and the solder mask layer 56 is provided to cover and protect surface circuits of the substrate 500, the molding process is performed, allowing the mold to be in contact with and abut against the solder mask layer 56 covering the molding ring 55, such that flashes can be prevented. Alternatively, the molding ring 55 may also be located slightly closer to an outer edge of an area where the substrate 500 is in contact with the mold; however, preferably the location of the molding ring 55 directly corresponds to the position for contacting the substrate 500 with the mold. It should be noted that the molding ring 55 is not limited to being formed on an 5 upper surface of the substrate 500 as shown in FIGS. 5A and 5B, but can be more flexibly situated according to the practical molding requirements. For example, the molding ring 55 can be provided on a lower surface of the substrate or on both the upper and lower surfaces of the substrate. Besides a continuous linear shape shown in FIGS. 5A and 5B, the molding ring 55 can also be formed as a continuous flexural shape or comprise discontinuous segments spaced from each other.

The solder mask layer 56 covers the substrate 500 to protect the surface circuits of the substrate 500 against external contamination or damage. To allow each of the substrate units 50 to be electrically connected to an external electronic element, a plurality of openings 560 are formed in the solder mask layer 56 by an exposure, development or laser technique, such that predetermined portions of the circuit structures 51 under the solder mask layer 56 can be exposed via the openings 560 and serve as electrical I/O connections (such as the bond pads 511 and the ball pads 514, etc.) for the substrate units 50. Further, a metallic protection layer such as a nickel/gold layer can be formed respectively on the portions of the circuit structures 51 exposed from the solder mask layer 56 via the plating buses 54 by an electroplating process.

FIG. 6 is a cross-sectional view showing the substrate 500 in FIG. 5 being subjected to a molding process. After a chip 610 is mounted on and electrically connected to each of the substrate units 50, a mold 650 having an upper mold cavity 651 is used to perform the molding process. A clamping area 652 of the mold 650 is positioned in correspondence with a predetermined mold clamp line (MCL) on the substrate 500, such that an encapsulating material 653 can be injected into the upper mold cavity 651 so as to completely fill the upper mold cavity 651 with the encapsulating material 653 and form an encapsulant for encapsulating the chips 610. With the molding ring 55 being provided at the predetermined MCL position on the substrate 500, when the mold 650 comes into contact with the solder mask layer 56 on the substrate 500, the mold 650 can tightly abut against the solder mask layer 56 covering the molding ring 55, without leaving any gap between the mold 650 and the solder mask layer 56. As a result, flashes can be prevented.

Figure 7A:
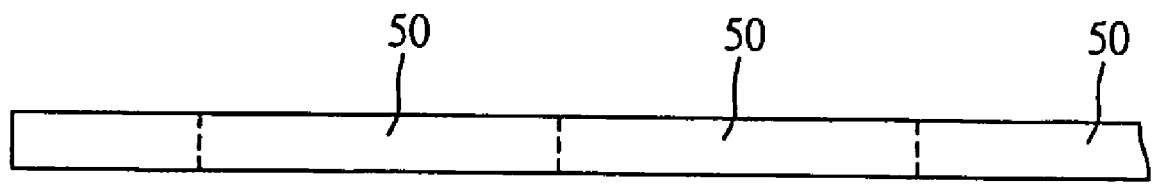
FIGS. 7A to 7C are cross-sectional views showing steps of a method for fabricating the flash preventing substrate according to the present invention.
Figure 7B:
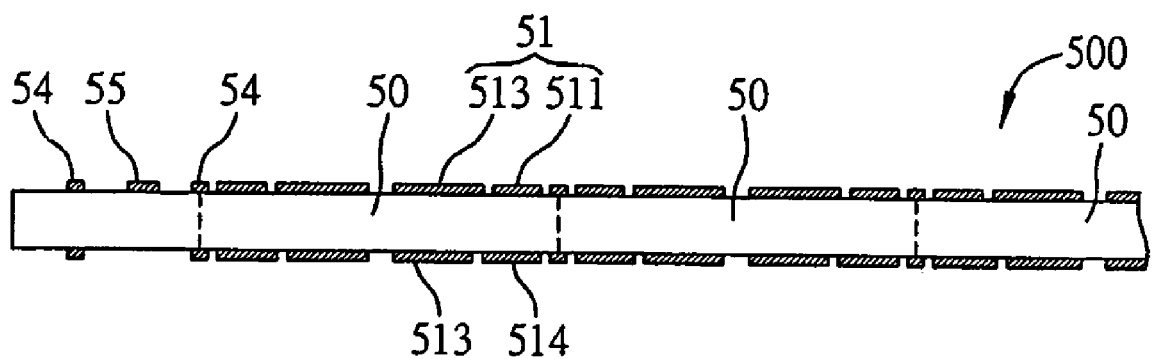
Figure 7C:
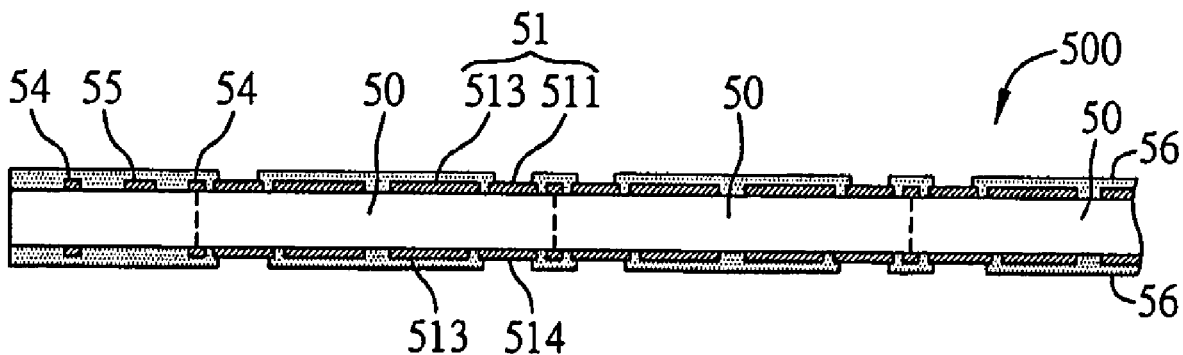

FIGS. 7A to 7C are cross-sectional views showing steps of a method for fabricating a flash preventing substrate according to the present invention.

Referring to FIG. 7A, firstly, a core defined with a plurality of substrate units 50 is prepared. The core can be a general insulating core plate for subsequently forming patterned circuit structures on a surface thereof, or alternatively, can be a circuit board preformed with predetermined circuitry.

Referring to FIG. 7B, a circuit patterning process is performed to form circuit structures 51 on the core corresponding to the substrate units 50, plating buses 54 between the adjacent substrate units 50, and a molding ring 55 surrounding all the substrate units 50. The plating buses 54 are extended and electrically connected to the circuit structures 51 of the substrate units 50. The molding ring 55 is located at a position predetermined for contacting the substrate with a mold.

Referring to FIG. 7C, a solder mask layer 56 is provided to cover the circuit structures 51, the plating buses 54 and the molding ring 55. The solder mask layer 56 is formed with a plurality of openings 560 therein, such that predetermined portions of the circuit structures 51 are exposed via the openings 560 and serve as electrical I/O connections.

Therefore, by the flash preventing substrate and the method for fabricating the same proposed in the present invention, a molding ring is formed at a peripheral position of the substrate surrounding all the substrate units simultaneously in a process of fabricating circuits for the substrate, and then a solder mask layer is applied on a surface of the substrate. This allows a mold used in a subsequent molding process to tightly abut against the solder mask layer covering the molding ring, so as to prevent outward flashes of an encapsulating material. Unlike the substrate in the prior art, the present invention can eliminate short-circuiting caused by burrs produced in a singulation process due to provision of dummy traces. Moreover, the present invention does not need to additionally fabricate a dam structure on the substrate after completing the circuitry of the substrate, such that the fabrication time and cost can both be reduced, and a mark-printing process to be performed on the substrate would not be affected.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flash preventing substrate, comprising:
    a plurality of substrate units formed with circuit structures;
    plating buses provided between the adjacent substrate units, wherein the plating buses are extended and electrically connected to the circuit structures of the substrate units;
    a molding ring surrounding all the substrate units and located at a position predetermined for contacting the substrate with a mold; and
    a solder mask layer for covering the circuit structures, the plating buses and the molding ring, wherein a plurality of openings are formed in the solder mask layer, such that predetermined portions of the circuit structures are exposed via the openings and serve as electrical input/output connections.

2. The flash preventing substrate of claim 1, wherein the substrate unit is a ball grid array (BGA) substrate unit.

3. The flash preventing substrate of claim 1, wherein the substrate unit is a thin and fine pitch ball grid array (TF-BGA) substrate unit.

4. The flash preventing substrate of claim 1, wherein the circuit structures comprise bond pads, conductive vias, conductive circuits and ball pads.

5. The flash preventing substrate of claim 4, wherein a metallic layer is electroplated respectively on the bond pads and the ball pads via the plating buses.

6. The flash preventing substrate of claim 1, wherein the molding ring is formed on the substrate simultaneously in a circuit patterning process for fabrication of the circuit structures of the substrate units and the plating buses.

7. The flash preventing substrate of claim 1, wherein the molding ring is made of a metallic copper material.

8. The flash preventing substrate of claim 1, wherein the molding ring is formed as a continuous linear shape or a continuous flexural shape, or comprises discontinuous segments spaced from each other.

9. A method for fabricating a flash preventing substrate, comprising the steps of:
    preparing a core defined with a plurality of substrate units;
    performing a circuit patterning process to form circuit structures on a surface of the core corresponding to the substrate units, plating buses between the adjacent substrate units, and a molding ring surrounding all the substrate units, wherein the plating buses are extended and electrically connected to the circuit structures of the substrate units, and the molding ring is located at a position predetermined for contacting the substrate with a mold; and
    forming a solder mask layer for covering the circuit structures, the plating buses and the molding ring, wherein the solder mask layer is formed with a plurality of openings therein, such that predetermined portions of the circuit structures are exposed via the openings and serve as electrical input/output connections.

10. The method of claim 9, wherein the substrate unit is a ball grid array (BGA) substrate unit.

11. The method of claim 9, wherein the substrate unit is a thin and fine pitch ball grid array (TFBGA) substrate unit.

12. The method of claim 9, wherein the circuit structures comprise bond pads, conductive vias, conductive circuits and ball pads.

13. The method of claim 12, wherein a metallic layer is formed respectively on the bond pads and the ball pads via the plating buses by an electroplating process.

14. The method of claim 9, wherein the molding ring is made of a metallic copper material.

15. The method of claim 9, wherein the molding ring is formed as a continuous linear shape or a continuous flexural shape, or comprises discontinuous segments spaced from each other.

* * * * *